United States Patent
Mos et al.

(10) Patent No.: US 10,564,670 B2
(45) Date of Patent: Feb. 18, 2020

(54) COMBINED CASE AND STAND FOR A PORTABLE COMPUTING DEVICE

(71) Applicant: Dataflex International B.V., Krimpen a/d IJssel (NL)

(72) Inventors: Roderik Johan Mos, Krimpen a/d IJssel (NL); Tijs Pieter Horn, Krimpen a/d IJssel (NL)

(73) Assignee: DATAFLEX INTERNATIONAL B.V., Krimpen a/d Ijssel (NL)

( * ) Notice: Subject to any disclaimer, the term of this patent is extended or adjusted under 35 U.S.C. 154(b) by 0 days.

(21) Appl. No.: 16/162,635

(22) Filed: Oct. 17, 2018

(65) Prior Publication Data

US 2019/0121393 A1    Apr. 25, 2019

(30) Foreign Application Priority Data

Oct. 24, 2017  (NL) ..................... 2019791

(51) Int. Cl.
    *G06F 1/16* (2006.01)
    *H05K 5/02* (2006.01)
    *F16M 11/00* (2006.01)

(52) U.S. Cl.
    CPC .......... *G06F 1/1628* (2013.01); *F16M 11/00* (2013.01); *H05K 5/0226* (2013.01); *H05K 5/0234* (2013.01); *H05K 5/0239* (2013.01); *H05K 5/0221* (2013.01)

(58) Field of Classification Search
    USPC .......... 206/320, 45.23, 45.24, 45.2; 220/810, 220/817, 820
    See application file for complete search history.

(56) References Cited

U.S. PATENT DOCUMENTS

| 6,119,851 | A | * | 9/2000 | Paciello | B42D 5/005 |
| | | | | | 206/214 |
| 2009/0178938 | A1 | | 7/2009 | Palmer | |
| 2009/0272661 | A1 | | 11/2009 | Liu | |
| 2011/0198250 | A1 | * | 8/2011 | Biston | H05K 5/0239 |
| | | | | | 206/320 |
| 2013/0313142 | A1 | * | 11/2013 | Wen | A45C 11/00 |
| | | | | | 206/320 |
| 2015/0060310 | A1 | * | 3/2015 | Tseng | A45C 11/00 |
| | | | | | 206/45.23 |

FOREIGN PATENT DOCUMENTS

GB        2400023 A      10/2004

OTHER PUBLICATIONS

NL Search Report and Written Opinion from NL2019791 dated Jan. 13, 2018, 10 pages.

* cited by examiner

*Primary Examiner* — Jacob K Ackun

(57) ABSTRACT

A combined case and stand for a portable computing device includes a container with a bottom wall and four side walls extending from four side edges of said bottom wall, a lid hingeably connected to said container near one of the side edges of the lid, and near one of said side walls. The lid is hingeable between a closed position, wherein said lid extends parallel to said bottom wall, and an open position, wherein said lid extends at an angle with said bottom wall. Means are provided for fixing said lid in said open position. The lid has a ledge facing away from the bottom wall with a longitudinal axis extending parallel to the hinge edge, such that during use a bottom edge of a portable computing device placed on said outer surface of said lid when the lid is in said open position is supported by said ledge.

8 Claims, 7 Drawing Sheets

Figure 1A:
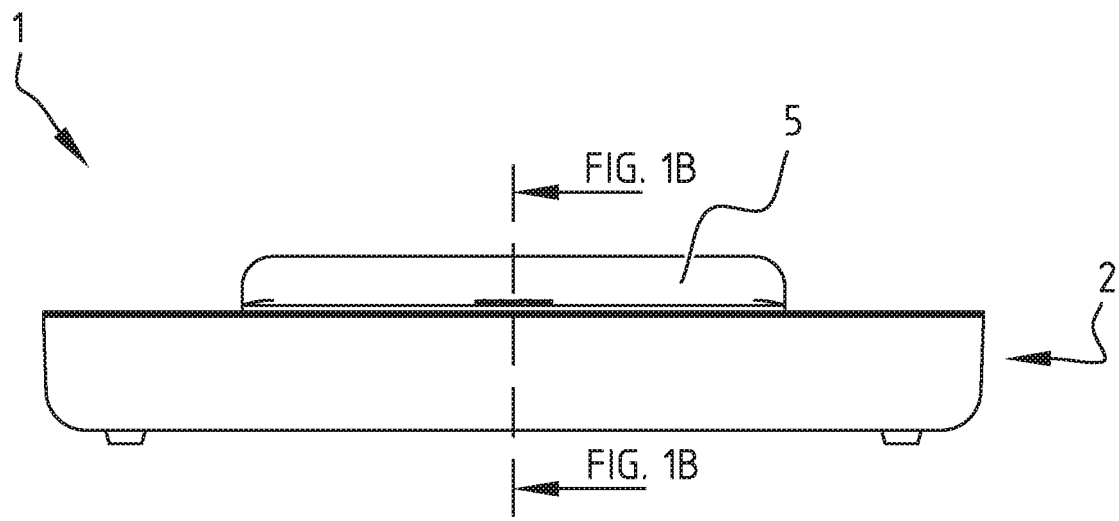
Figure 1B:
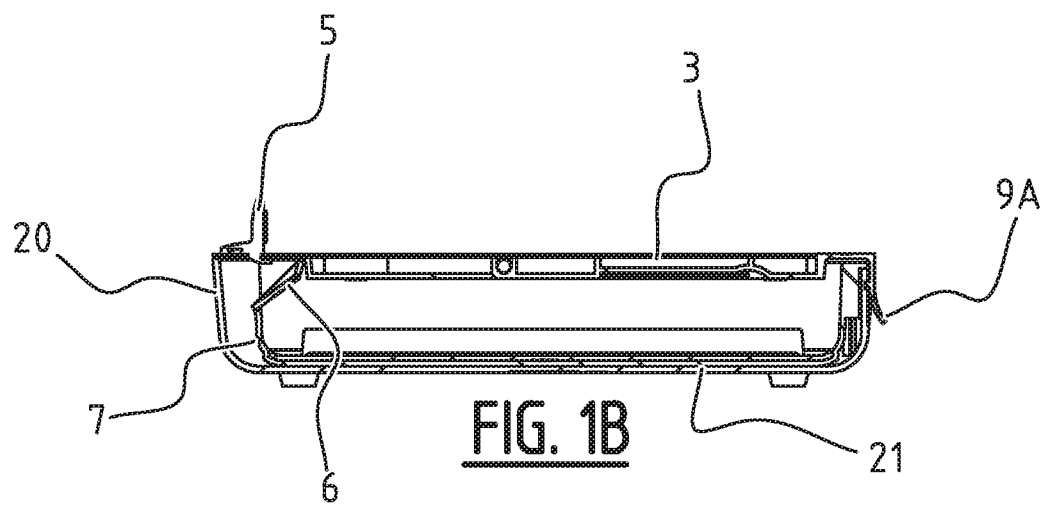

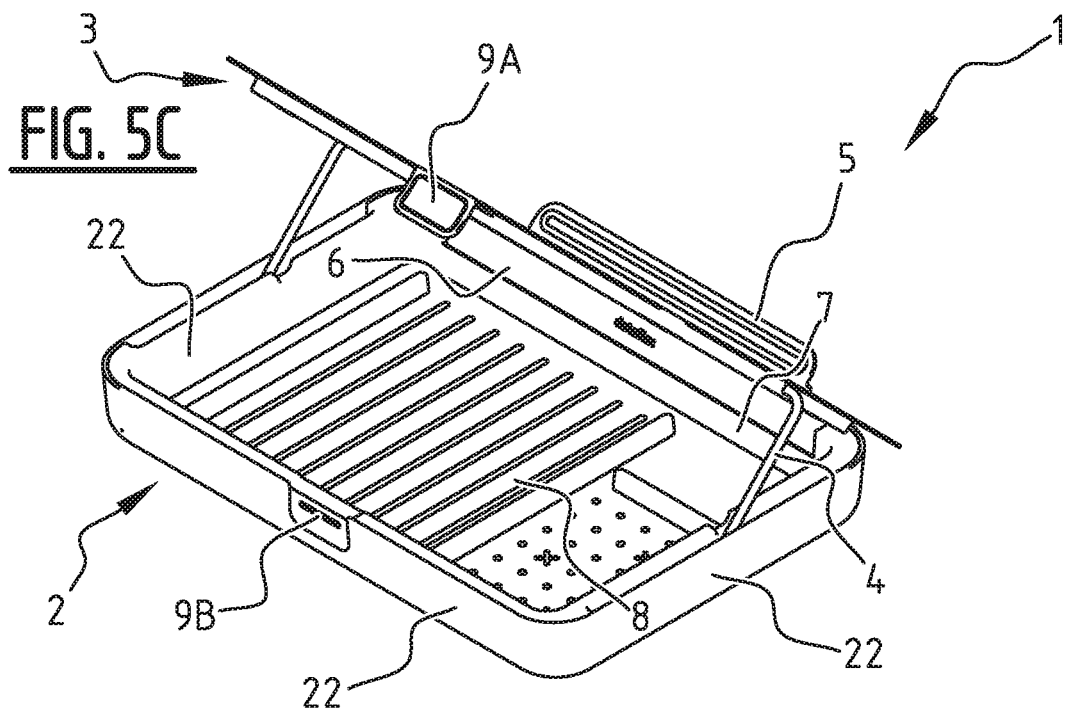
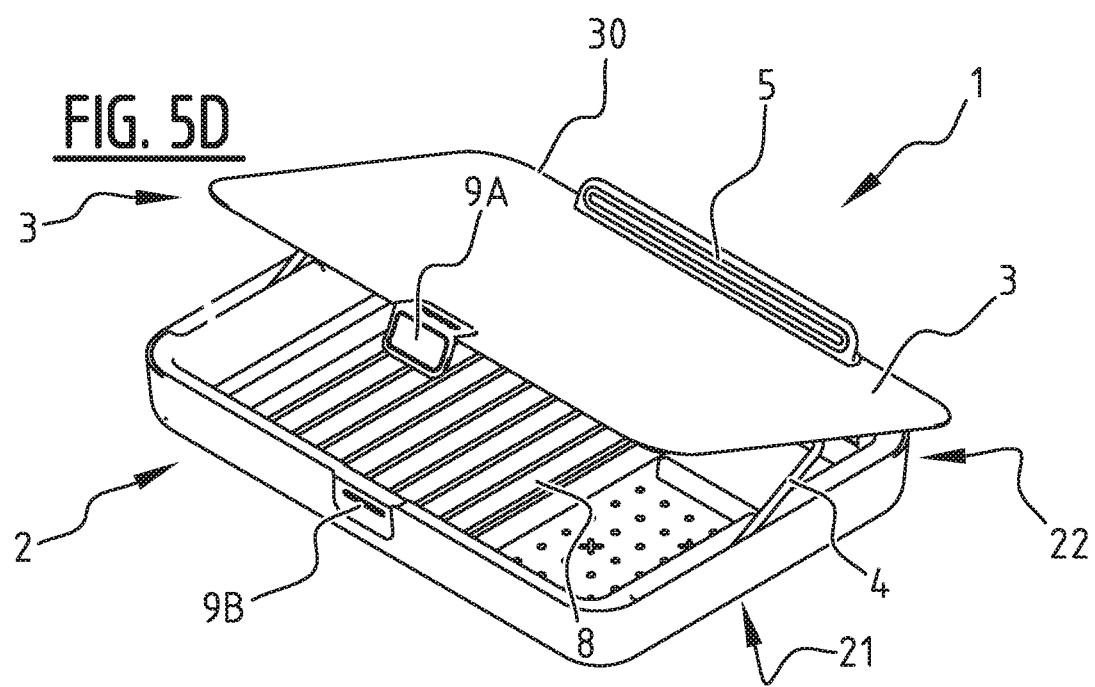

COMBINED CASE AND STAND FOR A PORTABLE COMPUTING DEVICE

This application is a US non-provisional of, and claims priority to, Netherlands Patent application NL 2019791, filed Oct. 24, 2017, the entirety of which application is incorporated by reference herein.

The present invention relates to a combined case and stand for a portable computing device, such as a laptop, notebook or tablet computer.

The goal of the invention is to provide a convenient, cheap, light-weight, compact, ergonomic, and/or rigid device to carry, store, and/or use a portable computing device, particularly in a setting other than a usual operating location, e.g. whilst a person is working remotely.

According to the invention the device comprises a container for holding the portable computing device, said container having a horizontal rectangular bottom wall and four upright side walls extending from the four side edges of said bottom wall, a matching rectangular lid which is hingeably connected to said container on the one hand near one of the side edges, hereinafter called the hinge edge, of the lid, and on the other hand near one of said side walls, hereinafter called the hinge side wall, of the container, wherein said lid is hingeable between a closed position, wherein said lid extends parallel to said bottom wall with its side edges near the top edges of the side walls, and at least one open position, wherein said lid extends at an angle with said bottom wall, and means for fixing said lid in said at least one open position, wherein said lid is provided with a ledge on the outer surface facing away from the bottom wall, the longitudinal axis of said ledge extending parallel to the hinge edge, such that during use a bottom edge of a portable computing device which is placed on said outer surface of said lid when the lid is in said at least one open position is supported by said ledge, wherein said lid is connected to said container by means of a linking member, wherein, seen in the closed position of the lid, one end of said linking member is hingeably connected to said lid having a hinge axis at a horizontal first distance from the top edge of the hinge side wall, and wherein an other end of said linking member is hingeably connected to said container having a hinge axis at a horizontal second distance from the top edge of the hinge side wall, wherein the first distance is larger than the second distance.

When the lid is moved to an opened position the linking member allows the hinge edge of the to be moved in the vertical direction towards the surface on which the case rests. The advantage of the invention is that the resulting reduction of the vertical distance between the ledge, which is provided on the lid, and said surface makes it more convenient for a person operating a portable computing device, which rests on said ledge, to operate said device due to reduced need of raising his or her forearms to a certain distance from said surface, or bending his or her wrists significantly, which is unfavorable from an ergonomics viewpoint. Such movement of the forearms and/or wrists might result in strain of the elbows and/or wrists of said person, which can lead to physiological ailments such as, for example, carpal tunnel syndrome. Hence, the invention reduces the risk of physiological ailments for a person operating a portable computing device resting upon said ledge.

Preferably, seen in the closed position of the lid, one end of said linking member is hingeably connected to said lid having a hinge axis at a horizontal third distance from the hinge edge of the lid, wherein said third distance is larger than 0 mm. The third distance is preferably approximately the same as the first distance. Furthermore, seen in the closed position of the lid, the ledge is preferably provided horizontally between the hinge edge of the lid and the location of the hinge axis between the lid and the linking member. It is further preferred that said other end of the linking member is hingeably connected to said container having a hinge axis at a vertical fourth distance from the top edge of the hinge side wall, wherein the fourth distance is larger than 0 mm. Preferably, the difference between the first distance and the second distance is between 0.5 and 2 times the fourth distance. The second distance is preferably between 0.5 and 2 times the fourth distance. Preferably, said fourth distance is between 0.5 and 1.5 times half the height of the side walls of the container.

Preferably, the interior of the container comprises a vertical, i.e. upright, wall parallel to the hinge side wall, which has a height defined as the height of said hinge side wall decreased with said vertical fourth distance from the top edge thereof. The top edge of this interior wall serves as a mounting location to which the said other end of the linking member can be hingeably connected. Consequently, the distance between said interior wall and said hinge side wall is defined as said horizontal second distance.

In a preferred embodiment said ledge is detachably connected to said lid, so as to obtain a regular exterior form of said case, i.e. no protruding elements on the lid, after detaching said ledge. Possibly, the ledge is storable within the interior of the case after detachment from the lid.

Figure 5A:
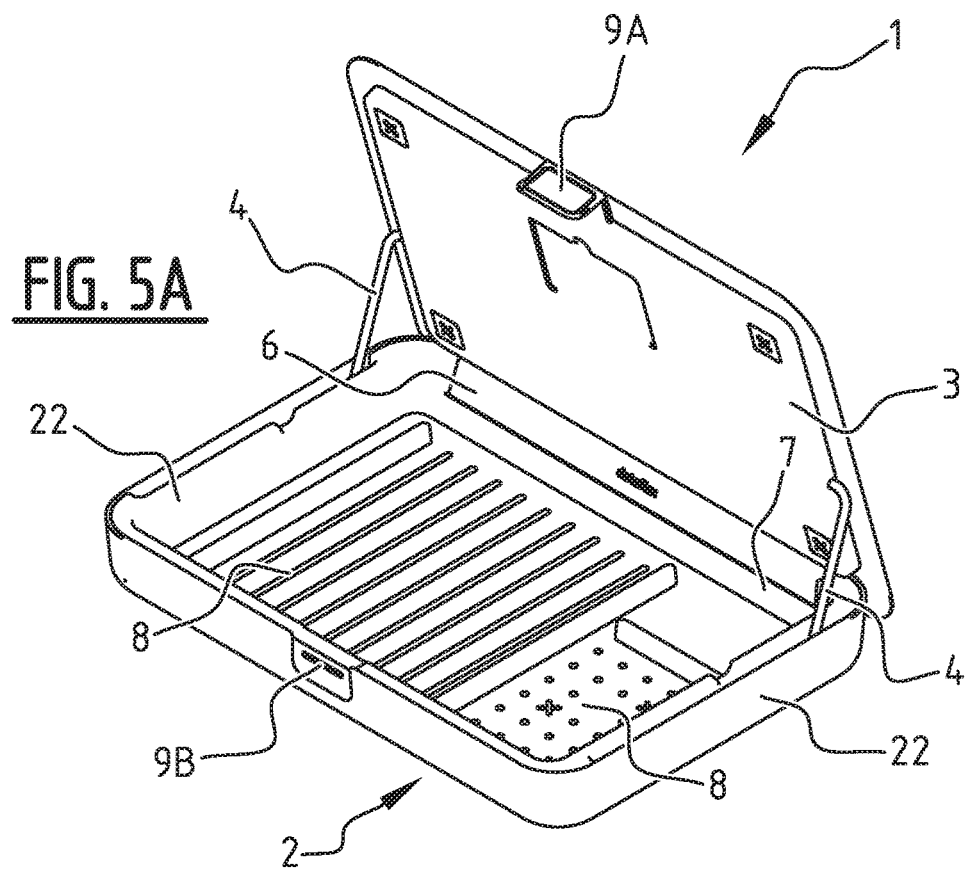
Figure 5B:
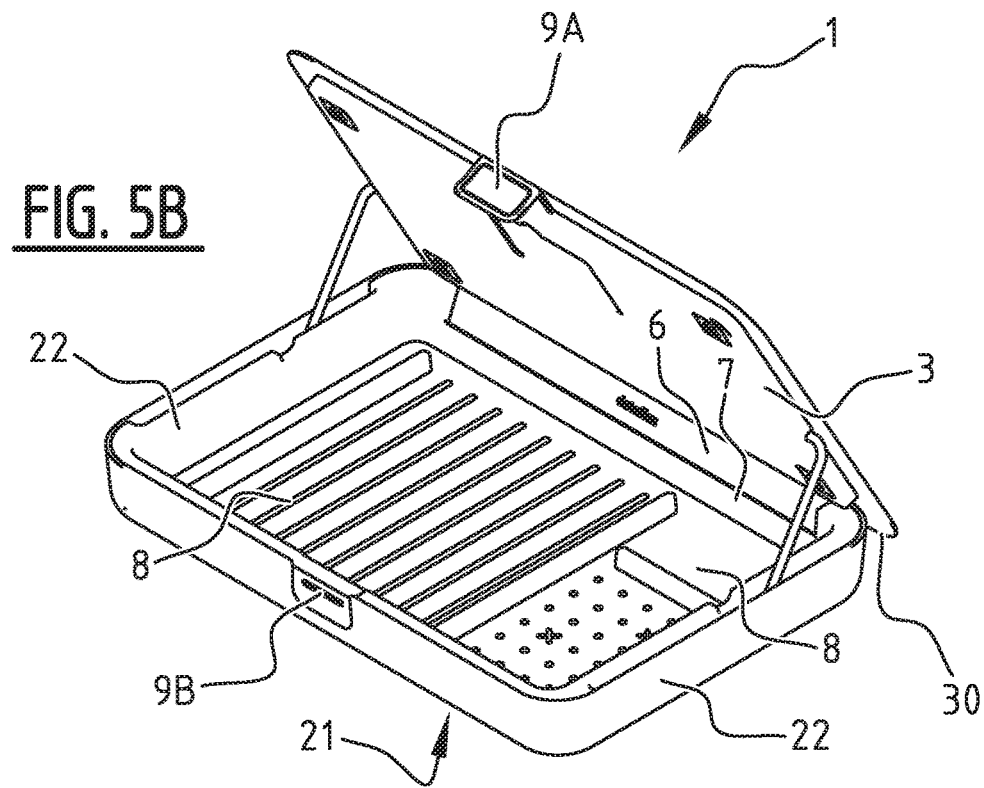
Figure 6:
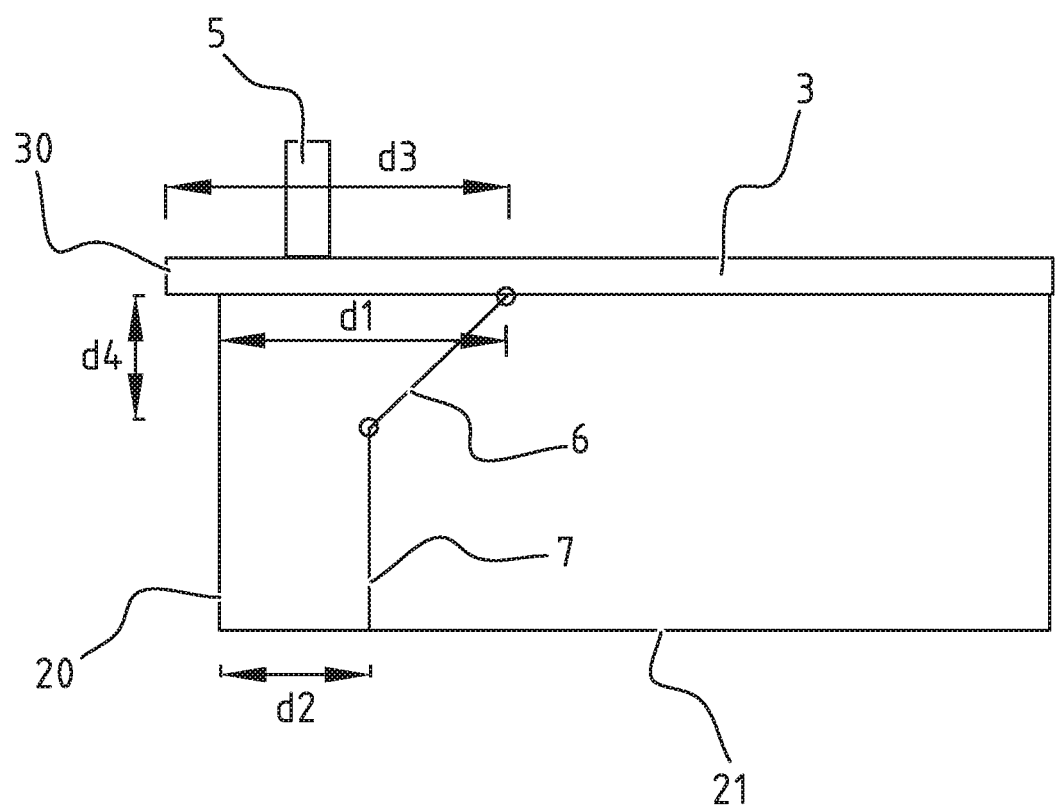

The invention will be elucidated with reference to the figures, wherein:

FIGS. 1A/B to 4A/B show tour operating positions of the device according to the invention, both from a back view facing the hinge side wall, and respective vertical cross-sections thereof as indicated;

FIGS. 5A/B/C/D show four operating positions of the device according to the invention, from an isometric viewing angle; and FIG. 6 shows a schematic side view of the hinging connection between the container, looking member and lid, and the associated distances relevant thereto.

FIGS. 1A/B to 4A/B and 5A/B/C/D show the case 1 according to the invention, comprising a container 2 for holding a portable computing device (not shown), a matching rectangular lid 3, which is hingeably connected to the container 2, means 4 for fixing the lid in several open positions. The lid is provided with a ledge 5 on the outer surface facing away from the bottom wall 21.

Figure 2A:
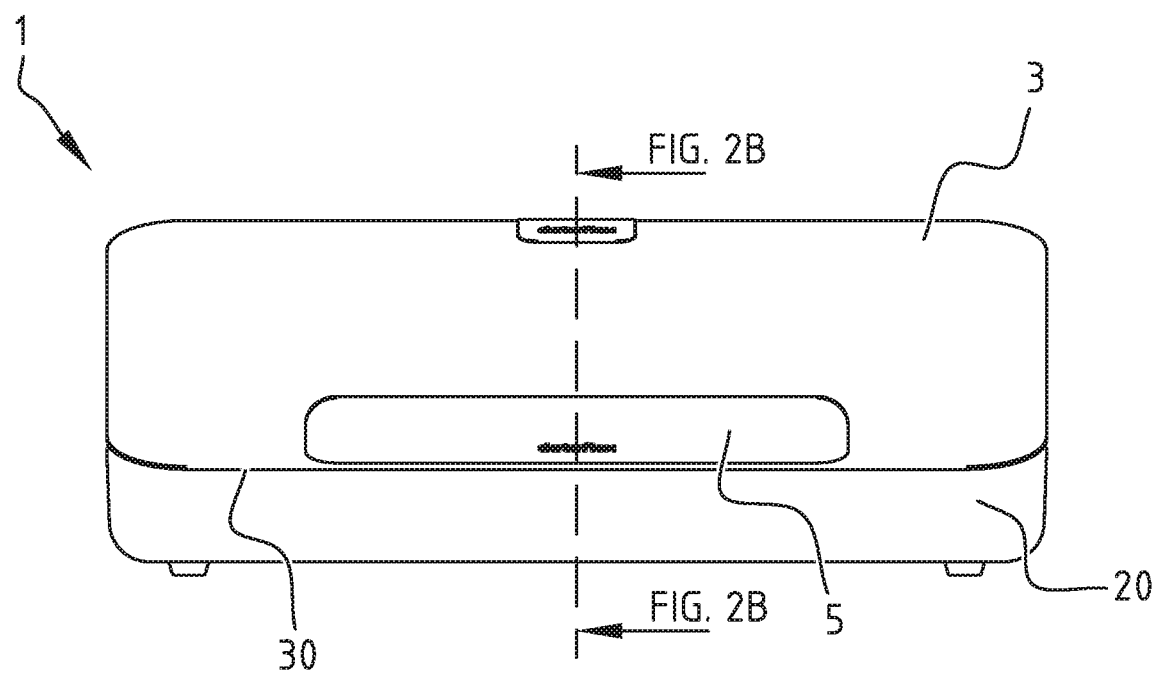
Figure 2B:
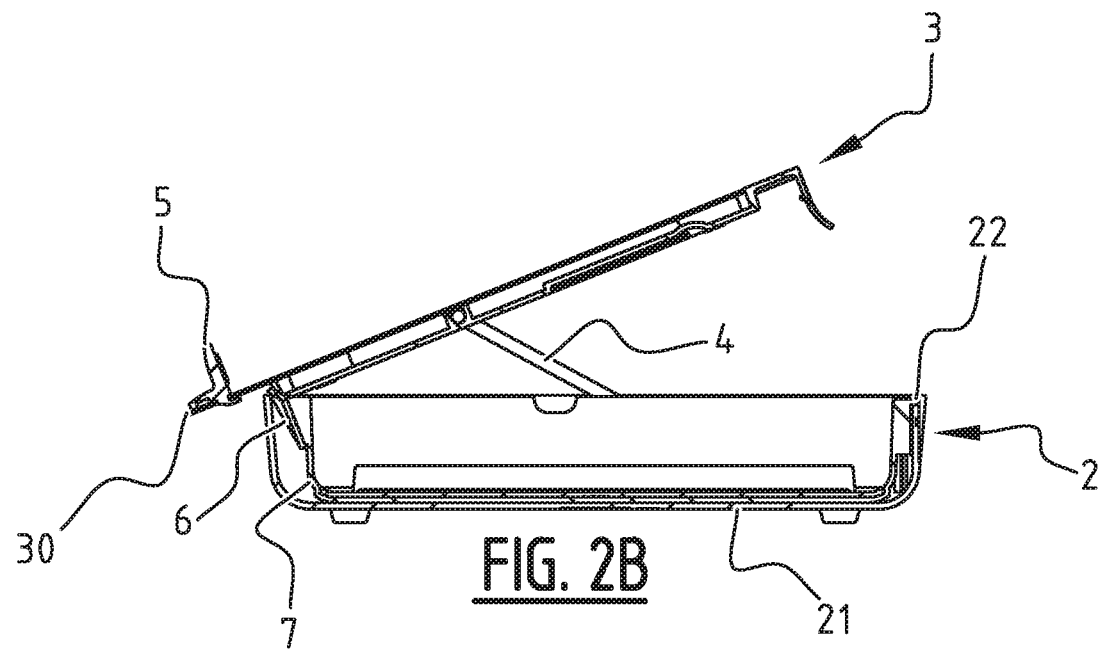
Figure 3A:
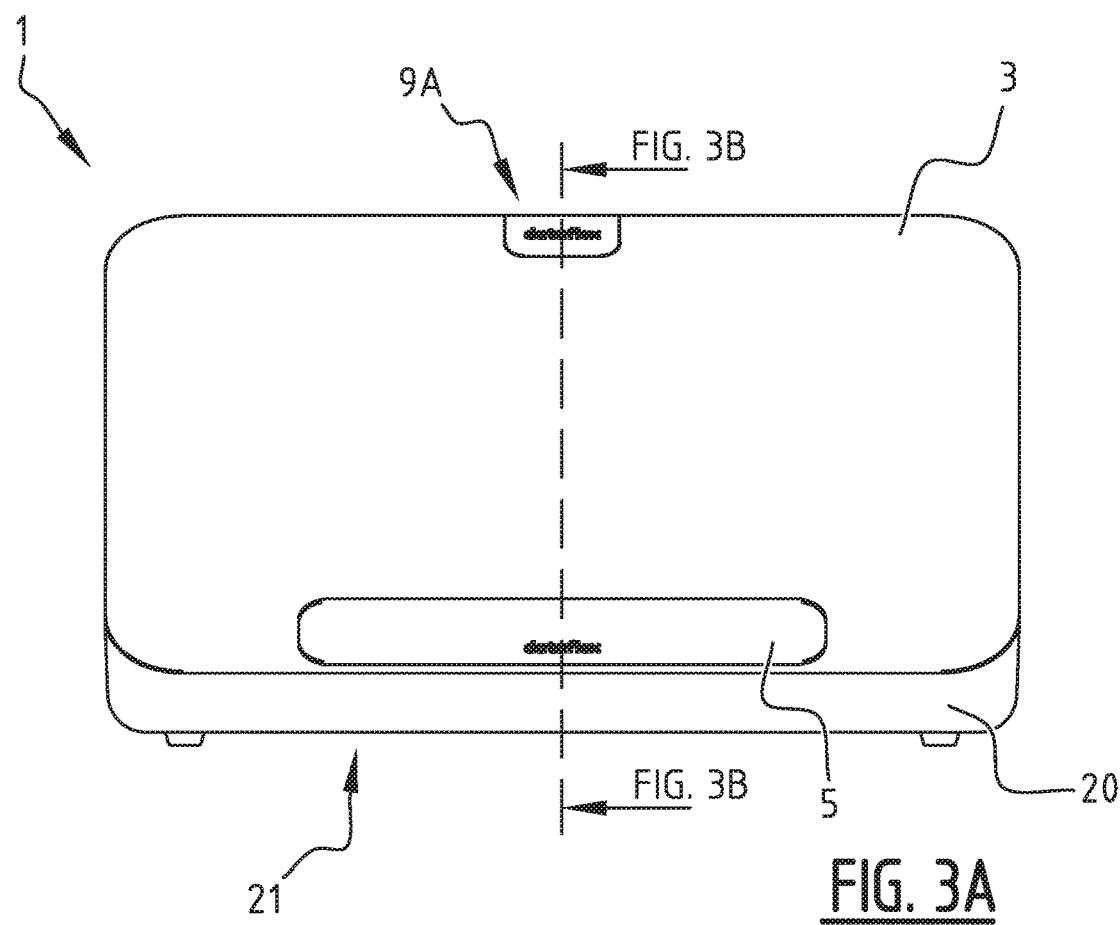
Figure 3B:
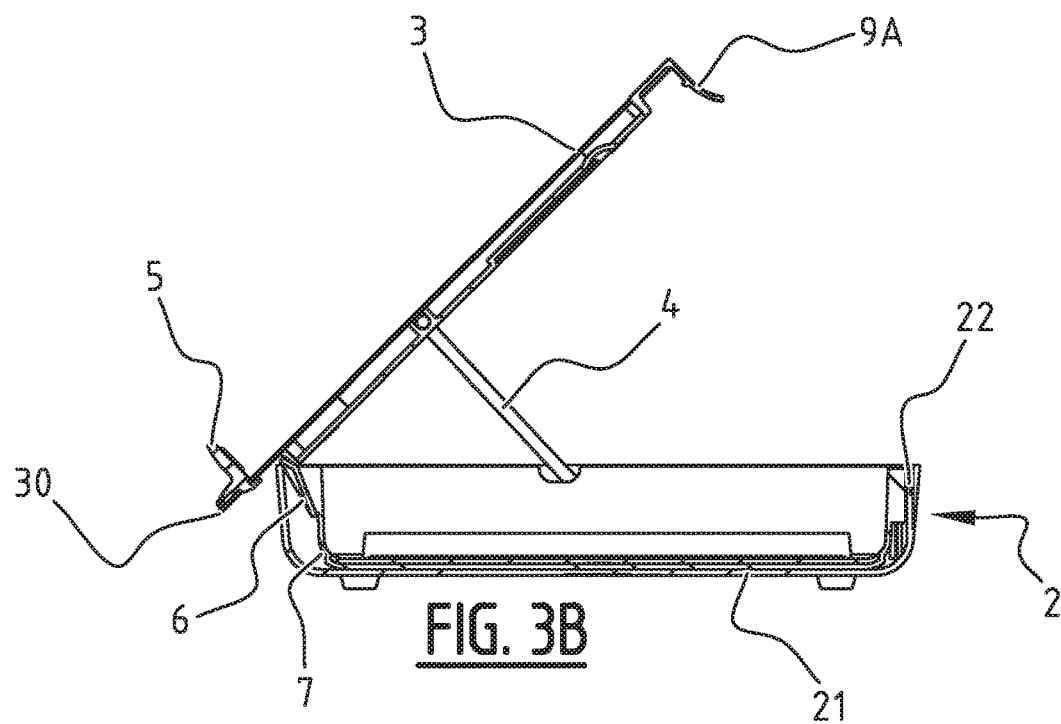
Figures 4A, 4B:
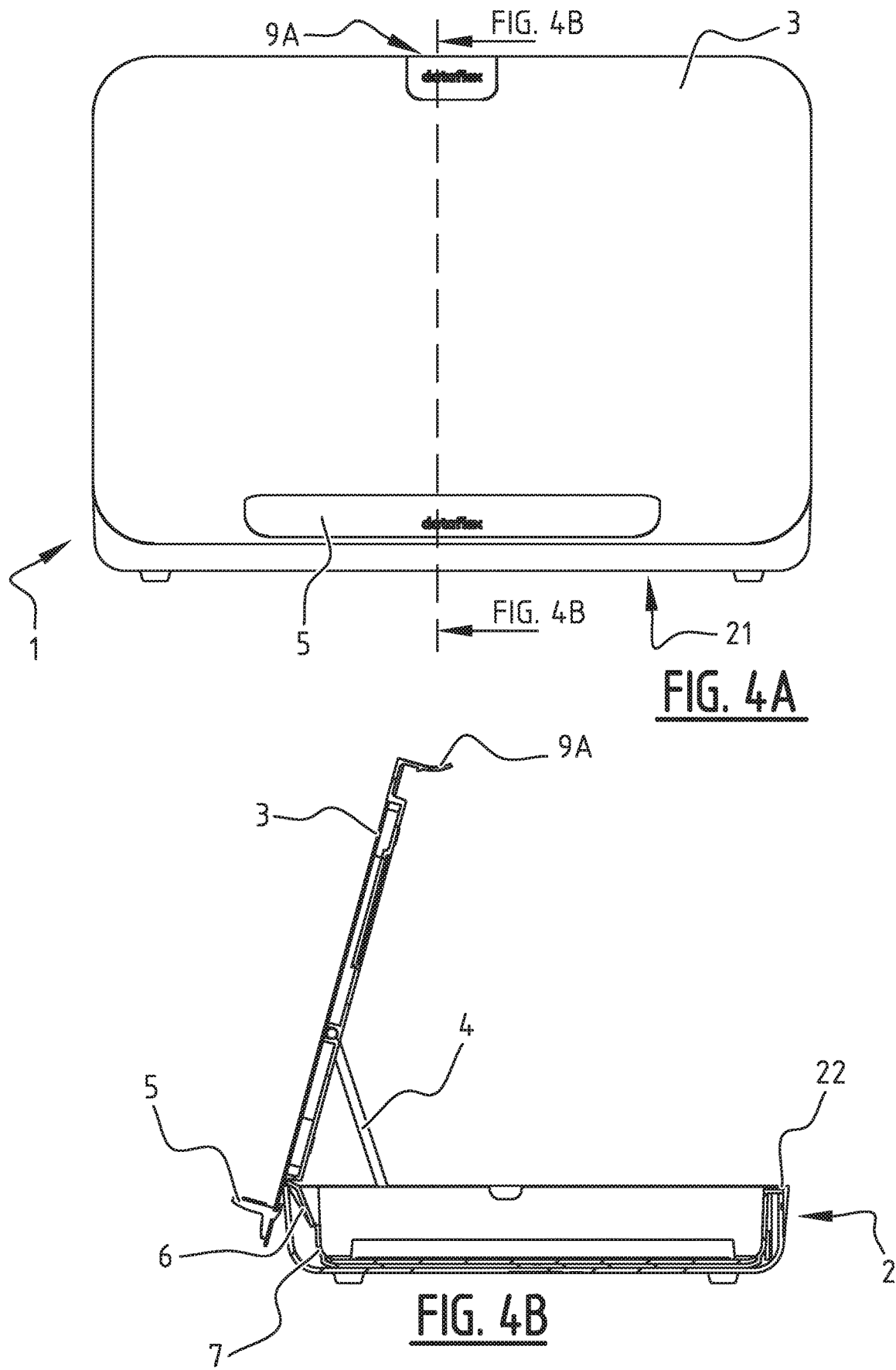

The container 2 has a horizontal rectangular bottom wall 21 and four upright side walls 22 extending from the four side edges of the bottom wall 21. The bottom interior of the container is provided with a compartmentation 8 for storing utensils, accessories and personal items under or around the portable computing device. Furthermore it is possible to store and carry documents in the container. The rectangular lid 3 is hingeably connected to the container 2 on the one hand near one of the side edges, hereinafter called the hinge edge 30, of the lid, and on the other hand near one of the side walls, hereinafter called the hinge side wall 20, of the container, wherein the lid 3 is hingeably between a closed position, as shown in FIG. 1A/B, wherein the lid 3 extends parallel to the bottom wall 21 with its side edges near the top edges of the side walls 22, and at least one open position, as illustrated in FIGS. 2A/B to 4A/B and FIGS. 5A/B/C/D, wherein the lid 3 extends at an angle with the bottom wall 21. The ledge 5 is provided on the lid 3 on the outer surface thereof facing away from the bottom wall 21, the longitudinal axis of the ledge 5 extending parallel to the hinge edge 30, such that during use a bottom edge of a portable computing device which is placed on the outer surface of the lid 3 when the lid is in the at least one open position is supported by the ledge 5. In the same manner documents can be placed on the lid. The lid 3 and the container 5 are furthermore provided with a locking member 9a, 9b for locking the lid in the closed position.

Referring to FIGS. 1A/B to 4A/B and FIG. 6, the lid 3 is connected to the container 2 by means of a linking member 6, wherein, seen in the closed position of the lid 3, one end of the linking member 6 is hingeably connected to the lid 3 having a hinge axis at a horizontal first distance d1 from the top edge of the hinge side wall 20, and wherein the other end of the linking member 6 is hingeably connected to the container 2 having a hinge axis at a horizontal second distance d2 from the top edge of the hinge side wall 20. The first distance d1 is larger than the second distance d2. The linking member 6 allows the hinge edge 30 of the lid 3, as seen in an opened position, to be lowered towards the surface on which the case 1 rests to a distance smaller than the length of the hinge side wall 20.

In a preferred embodiment the ledge 5 is detachably connected to the lid 3, so as to obtain a regular exterior form of the case 1, i.e. no protruding elements on the lid 3. Possibly, the ledge 5 is storable in the interior of the case 1 after detachment from the lid 3.

FIG. 6 shows a schematic side view of the interconnection between the lid 3, the linking member 6, and the container. A horizontal first distance d1 is defined with regard to the linking member 6, which is hingeably connected to the lid 3 having a hinge axis at the horizontal first distance d1 from the top edge of the hinge side wall 20. A horizontal second distance d2 is defined with regard to the linking member 6, which is hingeably connected to the container 2 having a hinge axis at a horizontal second distance d2 from the top edge of the hinge side wall 20, wherein the first distance d1 is specified to be larger than the second distance d2.

FIG. 6 further defines a horizontal third distance d3 with regard to the linking member 6, which is hingeably connected to the lid 3 having a hinge axis at a horizontal third distance d3 from the hinge edge 30 of the lid 3, wherein the third distance d3 is larger than 0 mm, preferably substantially larger than 0 mm. Furthermore, the aforementioned other end of the linking member 6 is hingeably connected to the container 2 having a hinge axis at a vertical fourth distance d4 from the top edge of the hinge side wall 20, wherein the fourth distance d4 is larger than 0 mm, preferably substantially larger than 0 mm. The connection point to the container can be a top edge of an interior wall 7, which has a height defined as the height of the hinge side wall 20 decreased with the vertical fourth distance d4 from the top edge thereof. Consequently, the distance between the interior wall 7 and the hinge side wall 20 is defined as the horizontal second distance d2. The distances d1, d2 and d4 are in the preferred embodiment chosen such that the linking member 6 extends at an angle of approximately 45 degrees (for instance between 30 and 60 degrees) with the bottom 21 wall as shown in FIG. 6. Furthermore the distance d1 is in the preferred embodiment approximately 2 times the distance d2,

The invention claimed is:

1. A combined case and stand for a portable computing device, such as a laptop, notebook or tablet computer, comprising:

a container for holding the portable computing device, said container having a horizontal rectangular bottom wall and four upright side walls extending from the four side edges of said bottom wall, a matching rectangular lid having side edges which is hingeably connected to said container on the one hand near one of the lid side edges, hereinafter called the hinge edge, of the lid, and on the other hand near one of said side walls, hereinafter called the hinge side wall, of the container, wherein said lid is hingeable between a closed position, wherein said lid extends parallel to said bottom wall with its side edges near the top edges of the side walls, and at least one open position, wherein said lid extends at an angle with said bottom wall, and means for fixing said lid in said at least one open position, wherein said lid is provided with a ledge on the outer surface facing away from the bottom wall, the longitudinal axis of said ledge extending parallel to the hinge edge, such that during use a bottom edge of a portable computing device which is placed on said outer surface of said lid when the lid is in said at least one open position is supported by said ledge, wherein said lid is connected to said container by means of a linking member, wherein, seen in the closed position of the lid, one end of said linking member is hingeably connected to said lid having a hinge axis at a horizontal first distance from the top edge of the hinge side wall, and wherein an other end of said linking member is hingeably connected to said container having a hinge axis at a horizontal second distance from the top edge of the hinge side wall, wherein the first distance is larger than the second distance.

2. The combined case and stand for a portable computing device as claimed in claim 1, wherein, in the closed position of the lid, one end of said linking member having a hinge axis at a horizontal third distance from the hinge edge of the lid, wherein said third distance is larger than 0 mm.

3. The combined case and stand for a portable computing device as claimed in claim 2, wherein the third distance is approximately the same as the first distance.

4. The combined case and stand for a portable computing device as claimed in claim 1, wherein, in the closed position of the lid, the ledge is disposed horizontally between the hinge edge of the lid and the location of the hinge axis between the lid and the linking member.

5. The combined case and stand for a portable computing device as claimed in claim 2, wherein said other end of the linking member is hingeably connected to said container having a hinge axis at a vertical fourth distance from the top edge of the hinge side wall, wherein the fourth distance is larger than 0 mm.

6. The combined case and stand for a portable computing device as claimed in claim 5, wherein the difference between the first distance and the second distance is between 0.5 and 2 times the fourth distance.

7. The combined case and stand for a portable computing device as claimed in claim 5, wherein the second distance is between 0.5 and 2 times the fourth distance.

8. The combined case and stand for a portable computing device as claimed in claim 5, wherein said fourth distance is between 0.5 and 1.5 times half the height of the side walls of the container.

* * * * *